United States Patent [19]
Yamazaki

[11] Patent Number: 5,766,977
[45] Date of Patent: Jun. 16, 1998

[54] METHOD FOR PRODUCING SEMICONDUCTOR DEVICE

[75] Inventor: Shunpei Yamazaki, Tokyo, Japan

[73] Assignee: Semiconductor Energy Laboratory Co., Ltd., Kanagawa-ken, Japan

[21] Appl. No.: 622,827

[22] Filed: Mar. 27, 1996

[30] Foreign Application Priority Data

Mar. 27, 1995 [JP] Japan .................................. 7-094409

[51] Int. Cl.$^6$ ................................................ H01L 21/84
[52] U.S. Cl. ...................... 438/151; 438/308; 438/795
[58] Field of Search ........................ 437/21, 40–41, 437/937; 438/151, 308, 795

[56] References Cited

U.S. PATENT DOCUMENTS

| | | |
|---|---|---|
| 4,113,514 | 9/1978 | Pankove et al. . |
| 4,605,447 | 8/1986 | Brotherton et al. . |
| 5,395,804 | 3/1995 | Ueda ............................ 437/233 |
| 5,397,719 | 3/1995 | Kim et al. ....................... 437/40 |
| 5,470,763 | 11/1995 | Hamada ......................... 437/21 |
| 5,504,020 | 4/1996 | Aomori et al. ................. 437/40 |

FOREIGN PATENT DOCUMENTS

| | | |
|---|---|---|
| 55-050663 | 4/1980 | Japan . |
| 55-050664 | 4/1980 | Japan . |
| 5-144804 | 6/1993 | Japan . |

*Primary Examiner*—John Niebling
*Assistant Examiner*—Richard A. Booth
*Attorney, Agent, or Firm*—Fish & Richardson P.C.

[57] ABSTRACT

In producing a semiconductor device using silicon semiconductor, thermal processing is performed in an atmosphere containing hydrogen. At this time, active hydrogen is generated by contacting the hydrogen to a heated nickel material. For example, a pipe which an inner surface thereof is covered with the nickel material is heated by a heater and a hydrogen gas is introduced into the pipe, in order to generate the active hydrogen, so that a semiconductor device formed on a resin substrate having a low heat resistance is annealed using the active hydrogen while maintaining at 150° C. ±20° C. for a desired period of time.

11 Claims, 3 Drawing Sheets

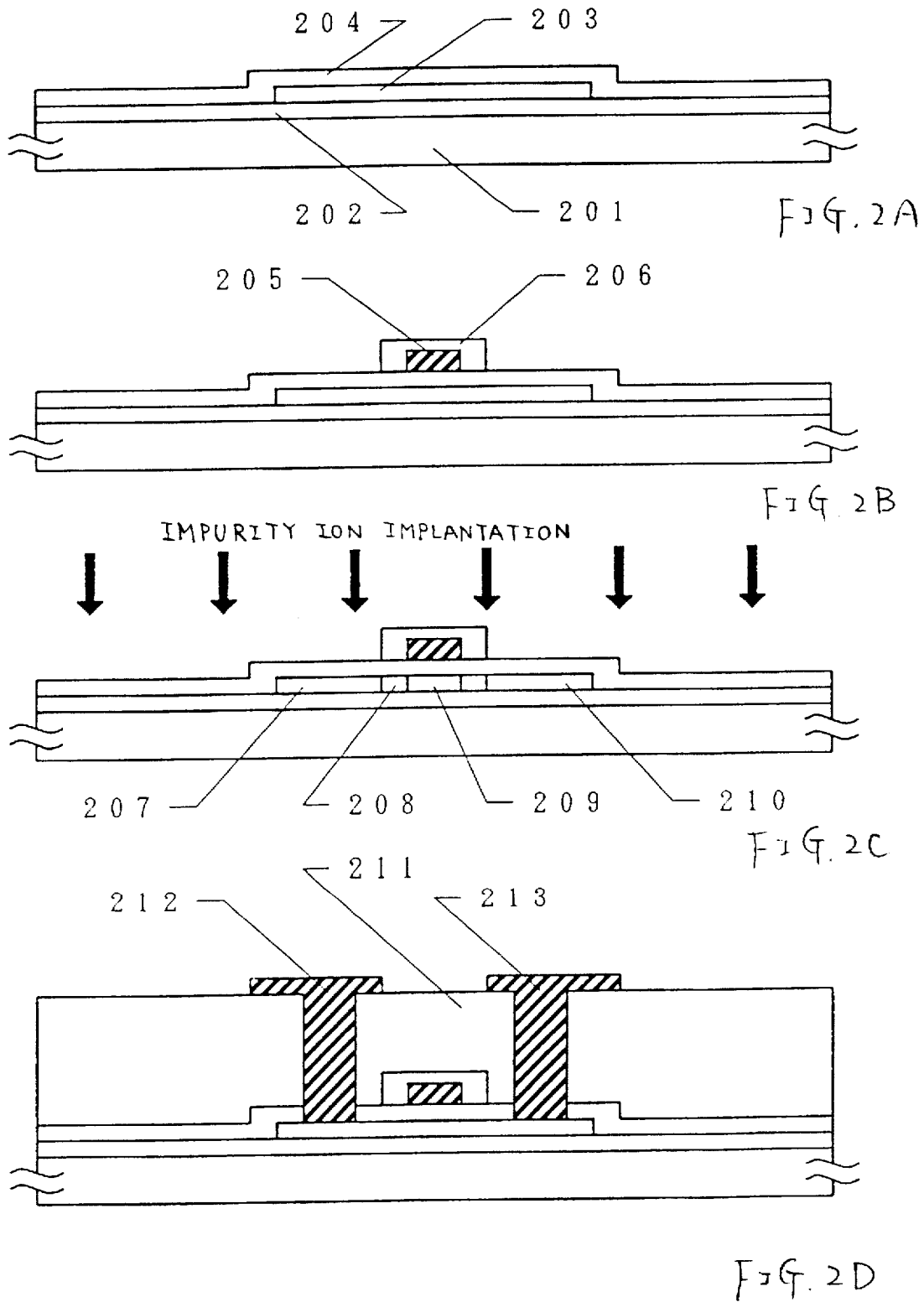

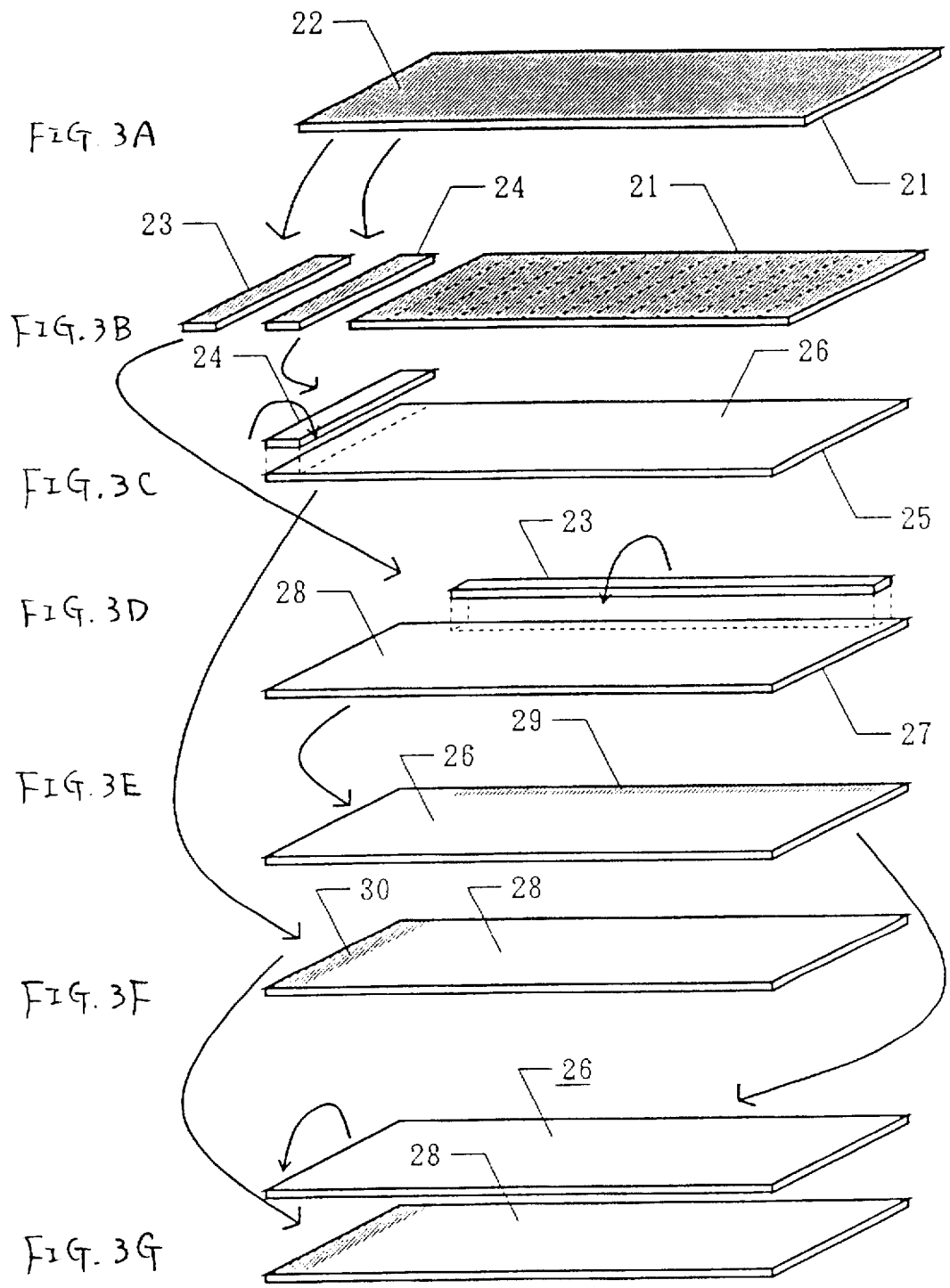

METHOD FOR PRODUCING SEMICONDUCTOR DEVICE

BACKGROUND OF THE INVENTION

1. Field of the Invention

The present invention relates to a technique for improving reliability of a semiconductor device.

2. Description of the Related Art

In a process for producing a MOS (metal oxide semiconductor) type semiconductor device, a technique for improving reliability of a semiconductor device to be produced by thermal processing in an atmosphere containing hydrogen has been known. In particular, in a semiconductor device using amorphous silicon and polycrystal silicon, its effect is large. This is because there is a cause in a crystal state such as amorphous or polycrystal. That is, in the crystal state, since dangling bonds are present at a high density, these form a trap level and thus there is a large effect with respect to termination due to hydrogen.

On the other hand, a semiconductor device using a thin film semiconductor, in particular, a thin film transistor (TFT) using a polycrystal silicon thin film has been concerned. An application field of the TFT using the polycrystal silicon thin film is mainly an active matrix type liquid crystal display device.

In a process for producing the TFT using the polycrystalline silicon thin film in order to improve characteristic and reliability of the TFT, thermal processing in an atmosphere containing hydrogen is performed in a final process. This technique is disclosed in Japanese Patent Application Open No. 4-355924. According to this technique, it is described that thermal processing at 250° C. to 350° C. in an atmosphere containing hydrogen is effective in order to decrease a level in an interface between a gate insulating film and a channel forming region in a MOS type TFT. In particular, it is shown in FIG. 5 that hydrogen thermal processing at 300° C. to 350° C. is most effective.

In an active matrix type liquid crystal display device, since an area thereof is large, it is effective to use a material containing aluminum or mainly aluminum as a wiring in order to suppress influence due to a resistance of the wiring. However, the aluminum has no high heat resistance. If a semiconductor device in which a wiring is formed using the aluminum is left in an atmosphere of 300° C. or higher, the aluminum is diffused into an insulating film and a semiconductor, and thus reliability of the device is reduced remarkably.

To solve this problem, after forming the wiring, processing in an atmosphere of preferably 200° C. or lower may be performed without exposing the wiring in an atmosphere of 300° C. or higher. However, as described above, it is effective to perform thermal processing at about 300° C. to 350° C. Also, a hydrogen thermal processing method for a semiconductor device using a material such as a resin substrate which cannot be resist thermal processing at a temperature higher than 200° C. is desired.

A technique for performing hydrogen thermal processing at a low temperature using a hydrogen active species without producing plasma is disclosed in Japanese Patent Application Open No. 5-144804. However, it is not disclosed that a semiconductor device such as a TFT disposed on a resin substrate having a low heat resistance is subjected to hydrogen thermal processing.

As described above, hydrogen thermal processing performed as a final process in a semiconductor device producing process is effective to improve its characteristic and reliability. However, when aluminum is used as a wiring material and an electrode material, thermal processing at a high temperature cannot be performed. That is, a thermal processing temperature cannot be set to 300° C. or higher. As a result, an effect due to hydrogen thermal processing cannot be obtained sufficiently.

SUMMARY OF THE INVENTION

The object of the present invention disclosed in the specification is to provide an effective hydrogen thermal technique under a temperature that a wiring and an electrode each containing aluminum or mainly aluminum can resist.

The present invention disclosed in the specification is characterized in that a sample temperature is maintained at 150° C. ±20° C. in a semiconductor device producing process.

Also, the present invention disclosed in the specification is characterized in that a hydrogen active species is generated by contacting hydrogen or a gas containing hydrogen to heated nickel or a heated material containing nickel, and a semiconductor device disposed on a resin substrate is annealed using the hydrogen active species.

In the above structure, it is effective to construct at least a part of the wiring in the semiconductor device by using nickel or nickel alloy.

The material containing nickel or the nickel alloy in the present invention disclosed in the specification is a multi-layer film of Ni and another material, Ni—Mo system alloy and Ni—W system alloy.

By contacting a hydrogen gas to the heated nickel, a hydrogen active species can be generated at a low temperature. A semiconductor material disposed on a substrate such as a resin substrate having a low heat resistance can be subjected to hydrogen thermal processing.

According to the present invention, there is provided a method for producing a semiconductor device comprising the steps of: forming a semiconductor film comprising silicon on a substrate in a chamber; forming an insulating film on the semiconductor film; forming a wiring comprising aluminum on the insulating film; generating a hydrogen active species in the chamber; and performing annealing using the hydrogen active species.

Also, according to the present invention, there is provided a semiconductor device producing method comprising the steps of: placing a semiconductor device in a chamber; generating a hydrogen active species in the chamber; and annealing the semiconductor device using the hydrogen active species at 150° C.±20° C.

Further, according to the present invention, there is provided a method for producing a semiconductor device comprising the steps of: placing a semiconductor device in a chamber; forming a material including nickel on an inner surface of a pipe connected to the chamber; heating the pipe; introducing a gas including hydrogen inside the pipe, to generate a hydrogen active species by contacting the heated material including nickel to the gas including hydrogen; and thermal-processing the semiconductor device using the hydrogen active species.

Furthermore, according to the present invention, there is provided a method for producing a liquid crystal display device comprising the steps of: placing a semiconductor integrated circuit in a chamber; generating a hydrogen active species in the chamber; and annealing the semiconductor integrated circuit using the hydrogen active species at 150° C. ±20° C.

BRIEF DESCRIPTION OF THE DRAWINGS

FIGS. 2A to 2D show a producing process for a thin film transistor; and

FIGS. 3A to 3G show a producing process for a substrate constructing a liquid crystal display device.

DETAILED DESCRIPTION OF THE PREFERRED EMBODIMENTS

[Embodiment 1]

Figure 1:
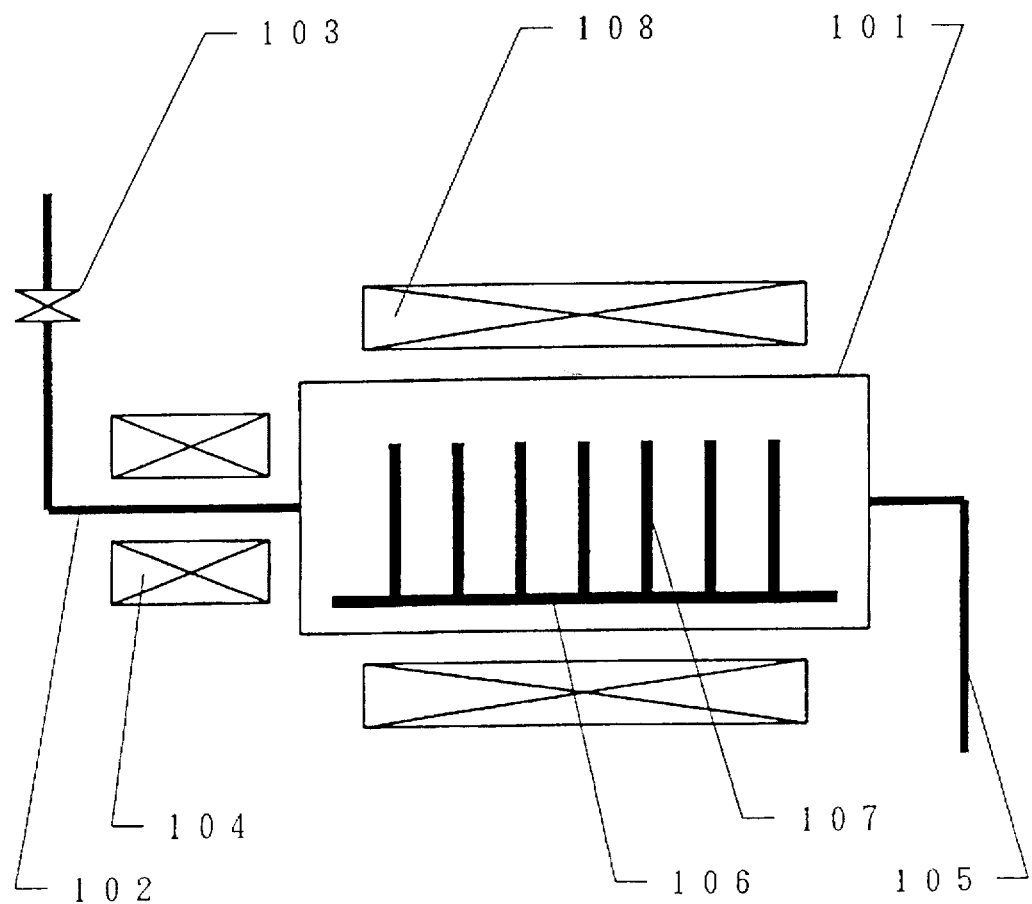
FIG. 1 is a schematic view of an apparatus for performing hydrogen thermal processing.

In the embodiment, a technique for utilizing the present invention disclosed in the specification in a producing process for a MOS (metal oxide insulator) type thin film transistor (TFT) formed on a glass substrate will be explained. FIGS. 2A to 2D show a producing process for a TFT according to the embodiment.

A silicon oxide film 202 having a thickness of 3000 Å is formed as a base film on a glass substrate 201 by sputtering. An amorphous silicon film having a thickness of 500 Å is formed by plasma chemical vapor deposition (plasma CVD) or low pressure thermal CVD, and then irradiated with a laser light to obtain a crystalline silicon film. The obtained crystalline silicon film has a substantially polycrystal structure.

The obtained crystalline silicon film is patterned to form an active layer 203 of a TFT. A silicon oxide film 204 used as a gate insulating film is formed at a thickness of 1000 Å by plasma CVD. Thus, a state of FIG. 2A is obtained.

A film containing mainly aluminum is formed by electron beam evaporation or sputtering. In the embodiment, an aluminum film containing scandium at 0.2 weight % is formed at a thickness of 5000 Å by electron beam evaporation. Further, patterning is performed to form a gate electrode 205.

By an anodization process, an oxide layer 206 is formed around the gate electrode 205, so that offset gate regions can be formed in an impurity ion implantation process to be performed later.

Anodization process is performed using the gate electrode 205 as an anode in an electrolytic solution. In this process, the anodic oxide layer 206 having a thickness of about 2000 Å is formed on an exposed surface of the gate electrode 205. (FIG. 2B)

An impurity ion is implanted to form source and drain regions. In the embodiment, phosphorus (P) ion is implanted to form an N-channel type TFT. At this time, since the gate electrode 205 and the surrounding anodic oxide layer 206 are used as masks, the source region 207 and the drain region 210 are formed in a self-alignment. Also, offset gate regions 208 are formed by using the anodic oxide layer 206 as a mask. A channel forming region 209 is formed under the gate electrode 205. After the ion implantation, a laser is irradiated to anneal a region in which the ion is implanted and to activate the implanted ion. (FIG. 2C)

A silicon oxide film 211 having a thickness of 6000 Å is formed as an interlayer insulating film by plasma CVD. Then, contact holes are formed to form a source electrode 212 and a drain electrode 213. Although not shown, the gate electrode wiring is formed at the same time. In the embodiment, these electrodes are constructed by a multilayer of a titanium film (1000 Å in thickness) and an aluminum film (4000 Å in thickness) containing silicon at 1 weight %.

Thermal processing in an atmosphere containing hydrogen is performed to neutralize dangling bonds in a region including mainly an interface between the active layer and the gate insulating film. In the embodiment, the hydrogen thermal processing is formed by using an apparatus as shown in FIG. 1 for 1 hour in an atmosphere of 150° C.

The apparatus of FIG. 1 includes a processing chamber 101 which is made of stainless and covered with nickel metal at a surface thereof, a pipe 102 for introducing a hydrogen gas into the processing chamber 101 wherein an inner surface thereof is covered with nickel metal, a valve 103 for controlling a quantity of the hydrogen gas to be introduced from the pipe 102 to the processing chamber 101, heaters 104 for heating the pipe 102, heaters 108 for heating the processing chamber 101 itself, a holder 106 on which samples (substrates) 107 are disposed wherein the samples are subjected to hydrogen thermal processing, and a pipe 105 for exhausting an unnecessary gas in the processing chamber 101.

A hydrogen gas introduced into the pipe 102 becomes active hydrogen in a portion of the pipe 102 heated by the heaters 104. That is, the active hydrogen is generated by reacting the hydrogen gas with nickel in an inner surface of the heated pipe 102. At this time, it is preferable that a heating temperature by the heaters 104 is 150° C.±20° C.

The hydrogen gas in the pipe 102 is introduced into the processing chamber 101. The processing chamber 101 is also heated at 150° C.±20° C. by the heaters 108, so that active hydrogen is filled in the processing chamber 101. Hydrogen thermal processing is performed by maintaining this state for a desired period of time.

[Embodiment 2]

In the embodiment, when a semiconductor integrated circuit required for a liquid crystal display device is formed on a substrate different from a substrate constructing the liquid crystal display device and then it is adhered to the substrate constructing the liquid crystal display device, an example that the present invention disclosed in the specification is applied thereto is shown.

FIGS. 3A to 3G shows a schematic producing order of a passive matrix type display device. A large number of semiconductor integrated circuits (peripheral driver circuits) 22 for driving an active matrix circuit are formed on a supporting substrate 21 through a peeling layer made of silicon oxide. (FIG. 3A)

As the supporting substrate 21, a single crystal wafer or a glass substrate can be used. In particular, when the single crystal wafer is used, a semiconductor integrated circuit having a high characteristic can be formed.

The supporting substrate 21 is divided to obtain stick crystals (stick substrates) 23 and 24. Electrical characteristics in the obtained stick crystals 23 and 24 are tested before performing next process, to select a good product. (FIG. 3B)

Surfaces of the stick crystals 23 and 24 in which circuits are formed are adhered on surfaces 26 and 28 of another substrates 25 and 27 in which patterns of wirings made of a transparent conductive film are formed, to perform electrical connection. (FIGS. 3C and 3D)

The substrates 25 and 27 are a transparent resin substrate and used as a pair of substrates constructing a liquid crystal display device. As such resin substrate, polyether sulfate (PES) can be used.

By using a gas containing halogen, the peeling layer is etched to peel the supporting substrate 21 from the stick crystals 23 and 24, so that only the semiconductor integrated circuits 29 and 30 remain on the surfaces 26 and 28 of the substrates 25 and 27. (FIGS. 3E and 3F)

The obtained substrates are opposed to one another, so that a passive matrix type display device is obtained. A surface 26 is a reverse surface of the surface 26, i.e., a surface on which a wiring pattern is not formed. (FIG. 3G)

In the above case, a row stick crystal (a stick crystal for a driver circuit for driving a row wiring) and a column stick crystal (a stick crystal for a driver circuit for driving a column wiring) are divided from the same substrate 21. However, these stick crystals may be divided from another substrate. Although the passive matrix type display device is shown in FIGS. 3A to 3G, the same process may be performed for an active matrix type display device.

When a wiring is completed, hydrogen thermal processing disclosed in the specification is performed as described in Embodiment 1. In this process, although a resin substrate having an extremely low heat resistance is used, it can resist thermal processing at about 150° C. That is, even if the resin substrate is used, hydrogen thermal processing can be performed by using the present invention disclosed in the specification, so that characteristic and reliability of a semiconductor device can be improved.

What is claimed is:

1. A method for producing a semiconductor device comprising the steps of:

forming a semiconductor film comprising silicon on a substrate in a chamber;

forming an insulating film on the semiconductor film;

forming a wiring comprising aluminum on the insulating film;

generating a hydrogen active species in the chamber by reacting a heated material including nickel with a gas including hydrogen; and performing annealing using the hydrogen active species at a temperature of 150°+20° C.

2. A method according to claim 1 wherein the substrate comprises a glass substrate.

3. The method of claim 1 wherein the substrate comprises a resin substrate.

4. A method according to claim 1 wherein the annealing is performed at a temperature that the aluminum is not diffused into the insulating film.

5. A method according to claim 1 wherein the wiring further comprises nickel.

6. A semiconductor device producing method comprising the steps of:

placing a semiconductor device in a chamber, said semiconductor device comprising a wiring including aluminum;

generating a hydrogen active species in the chamber by reacting a heated material including nickel with a gas including hydrogen; and annealing the semiconductor device using the hydrogen active species at 150° C.±20° C.

7. A method according to claim 6 wherein the wiring further comprises nickel.

8. A method for producing a semiconductor device comprising the steps of:

placing a semiconductor device in a chamber, said semiconductor device comprising a wiring including aluminum;

forming a material including nickel on an inner surface of a pipe connected to the chamber;

heating the pipe;

introducing a gas including hydrogen inside the pipe, to generate a hydrogen active species by contacting the heated material including nickel to the gas including hydrogen; and thermal-processing the semiconductor device using the hydrogen active species at a temperature of 150+20 C.

9. A method according to claim 8 wherein the wiring further comprises nickel.

10. A method for producing a liquid crystal display device comprising the steps of:

placing a semiconductor integrated circuit in a chamber, said semiconductor integrated circuit comprising a wiring including aluminum;

generating a hydrogen active species in the chamber by reacting a heated material including nickel with a gas including hydrogen; and annealing the semiconductor integrated circuit using the hydrogen active species at 150 C.±20 C.

11. A method according to claim 10 wherein the wiring further comprises nickel.

* * * * *

UNITED STATES PATENT AND TRADEMARK OFFICE
CERTIFICATE OF CORRECTION

PATENT NO.   : 5,766,977
DATED        : June 16, 1998
INVENTOR(S)  : Shunpei Yamazaki It is certified that error appears in the above-identified patent and that said Letters Patent is hereby corrected as shown below:

Column 5,
Line 31, please correct "150°+20°C" to read -- 150 ± 20°C --.

Column 6,
Line 10, please correct "150°C.±20° C." to read -- 150°C ± 20°C --.
Line 26, please correct "150+20 C" to read -- 150 ± 20°C --.
Line 38, please correct "150 C.±20 C" to read -- 150°C ± 20°C --.

Signed and Sealed this

Thirtieth Day of April, 2002

Attest:

Attesting Officer

JAMES E. ROGAN
Director of the United States Patent and Trademark Office